United States Patent
Winningham et al.

(10) Patent No.: US 6,579,463 B1
(45) Date of Patent: Jun. 17, 2003

(54) TUNABLE NANOMASKS FOR PATTERN TRANSFER AND NANOCLUSTER ARRAY FORMATION

(75) Inventors: Thomas Andrew Winningham, Broomfield, CO (US); Kenneth Douglas, Boulder, CO (US)

(73) Assignee: The Regents of the University of Colorado, Boulder, CO (US)

( * ) Notice: Subject to any disclaimer, the term of this patent is extended or adjusted under 35 U.S.C. 154(b) by 189 days.

(21) Appl. No.: 09/642,135

(22) Filed: Aug. 18, 2000

(51) Int. Cl.[7] ............................................. C23C 22/00
(52) U.S. Cl. ................. 216/41; 216/4; 216/56; 216/39; 428/333; 428/522; 156/630; 156/633
(58) Field of Search ................. 216/56, 39–41, 216/4–12; 429/333, 522, 324, 474; 156/630, 633, 643, 644

(56) References Cited

U.S. PATENT DOCUMENTS

| | | |
|---|---|---|
| 4,728,591 A | 3/1988 | Clark et al. |
| 4,802,951 A | 2/1989 | Clark et al. |
| 5,229,320 A | 7/1993 | Ugajin |
| 5,559,822 A | 9/1996 | Pankove et al. |
| 5,703,896 A | 12/1997 | Pankove et al. |
| 5,882,538 A | 3/1999 | Martin et al. |
| 5,917,285 A | 6/1999 | Gillis et al. |
| 5,948,470 A | 9/1999 | Harrison et al. |
| 6,027,663 A | 2/2000 | Martin et al. |
| 6,033,587 A | 3/2000 | Martin et al. |

OTHER PUBLICATIONS

Deutsche Sammlung Von Mikroorganismen Und Zellkulturen GMBH, German Collection of Microorganism and Cell Cultres, downloaded from website http://www.dsmz.de/dsmzhome.htm and subsequent web pages on Jul. 9, 2002.

Mertig, Kirsh, Pompe and Engelhardt; Fabrication of Highly Oriented Nanocluster Arrays By Biomolecular Templating The European Physical Journal D (Eur. Phys. J.D 9, 45–48 (1999).*

Bhatia, Suresh K. et al., "Fabrication of Surfaces Resistant to Protein Adsorption and Application to Two–Dimensional Protein Patterning," *Analytical Biochemistry*, vol. 208, 1993, pp. 197–205.

(List continued on next page.)

Primary Examiner—Alexander Markoff
Assistant Examiner—Gentle Winter
(74) Attorney, Agent, or Firm—Marian J. Furst, Attorney at Law; Marian J. Furst

(57) ABSTRACT

A method of manufacturing an array of nanostuctures, such as quantum dots, having a controlled diameter and a substrate with an ordered array of nanostructures having a controlled diameter. In a preferred embodiment of the invention, nanoscale features are produced on a substrate by using a porous crystalline protein as a template for preparing an etch/deposition mask having a regular array of nanoscale pores of a diameter different from the protein template. The mask may be used to etch a regular array of nanoscale wells and/or deposit nanoclusters of adatoms on the surface of an underlying substrate. A further embodiment of the invention is a substrate including an ordered array of nanoscale features having a controlled size.

19 Claims, 9 Drawing Sheets

OTHER PUBLICATIONS

Brock, Thomas D. et al., "Solfulobus: A New Genus of Sulfure–Oxidizing Bacteria Living at Low pH and High Temperature," *Arch. Mikrobiol.* 84, Springer–Verlag, 1972, pp. 54–68.

Calvert, Jeffrey M. et al., "Deep Ultraviolet Lithography of Monolayer films with Selective Electroless Metallization," *J. Electrochem. Soc.* vol. 139, Jun. 1992, pp. 1677–1680.

Calvert, Jeffrey M. et al., "Photoresist channel–constrained deposition of electroless metallization on ligating self–assembled films," *J. Vac. Sci. Technol. B*, vol. 6, Nov./Dec. 1994, pp. 3884–3887.

Deatherage, J.F. et al., "Three–dimensional Arrangement of the Cell Wall Protein of *Sulfolobus acidocalddarius*," *J. Mol. Biol.*, vol. 167, 1983, pp. 823–852.

Douglas, Kenneth et al., "Nanometer Molecular Lithography," *Appl. Phys. Lett.*, vol. 48, No. 10, Mar. 10, 1986, pp. 676–678; correlation in *Appl. Phys. Lett.*, vol. 48, No. 26, Jun. 30, 1986, p. 1812.

Douglas, Kenneth et al., "Transfer of Biologically Derived Nanometer–Scale Patterns to Smooth Substrates," *Science*, vol. 257, Jul. 31, 1992, pp. 642–644.

Gérard, Jean–Michel et al., "Prospects of High–Efficiency Quantum Boxes Obtained by Direct Epitaxial Growth," in *Confined Electrons and Photons: New Physics and Applications*, Elias Burstein and Claude Weisbuch, eds., Plenum Press, New York, 1995, pp. 357–381.

Gillis, H.P. et al., "Low–energy electron beam enhanced etching ot Si(100)–(2x1) by molecular hydrogen," *J. Vac. Sci. Technol B*, vol. 10, No. 6, Nov./Dec. 1992, pp. 2719–2733.

Gillis, H.P. et al., "Low energy electron–enhanced etching of Si(100 in hydrogen/helium direct–current plasma," *Appl. Phys. Lett.*, vol. 66, No. 19, May 8, 1995, pp. 2475–2477.

Grogan, Dennis W., "Phenotypic Characterization of the Archaebacterial Genus Sulfolobus: Comparison of Five Wild–Type Strains," *J. Bacteriology*, vol. 171, No. 12, Dec. 1989, pp. 6710–6719.

Grundman, M. et al., "Ultranarrow Luminescence Lines from Single Quantum Dots," *Phys. Rev. Lett.*, vol. 74, No. 20, May 15, 1995, pp. 4043–4046.

Harrison, Christopher et al., "Lithography with a mask of block copolymer microstructures," *J. Vac. Sci. Technol. B*, vol. 16, No. 2, Mar./Apr. 1968, pp. 544–552.

Heath, J.R. et al., "Spatially Confined Chemistry: Fabrication of Ge Quantum dot Arrays," *J. Phys. Chem.*, vol. 100, 1996, pp. 3144–3149.

Heath, James R. et al, "Pressure/Temperature Phase Diagrams and Superlattices of Organically Functionalized Metal Nanocrystal Monolayers: The Influence of Particle Size, Size Distribution, and Surface Passivant," *J. Phys. Chem. B*, vol. 101, 1997, pp. 189–197.

Hulteen, John C. et al., "Nanosphere lithography: A materials general fabrication process for periodic particle array surfaces," *J. Vac. Sci. Technol. A*, vol. 13, No. 3, May–Jun. 1995, pp. 1553–1558.

Jackman, Rebecca J. et al., "Fabrication of Submicrometer Features on Curved Substrates by Microcontact Printing," *Science*, vol. 279, Aug. 4, 1995, pp. 664–666.

Kim, Enoch et al., "Combining Patterned Self–Assembled Monolayers of Alkanethiols on Gold with Anistropic Etching of Silicon to Generate Controlled Surface Morphologies," *J. Electrochem. Soc.*, vol. 142, No. 2, Feb. 1995, pp. 628–632.

Kirstaedter, N. et al., "Gain and differential gain of single layer InAs/GaAs quantum dot injection lasers," *Appl. Phys. Lett.*, vol. 69, No. 9, Aug. 26, 1996, pp. 1226–1228.

Kumar et al., "Fuatures of gold having micrometer to centimeter dimensions can be formed through a combination of stamping with an elastomeric stammp and an alkenathiol "ink" followed by chemical etching," *Appl. Phys. Lett.*, vol. 63, No. 14, Oct. 4, 1993, pp. 2002–2004.

Kumar, Amit et al., "Patterning Self–Assembled Monolayers: Applications in Materials Science," *Langmuir*, vol. 10, 1994, pp. 1498–1511.

Lembcke, G. et al., "Image analysis and processing of an imperfect two–dimensional crystal: the surface layer of the archaebacterium *Sulfolubus acidocaldarius* re–investigated," *J. Microscopy*, vol. 161, Pt. 2, Feb. 1991, pp. 263–278.

Lercel, M.J. et al., "Sub–10 nm lithography with self–assembled monolayers," *Appl. Phys. Lett.*, vol. 68, No. 11, Mar. 11, 1986, pp. 1504–1506.

Luedtke, W.D. et al., "Structure, Dynamics, and Thermodynamics of Passivated Gold Nanocrystallites and Their Assemblies," *J. Phys. Chem.*, vol. 100, No. 32, Aug. 8, 1996, pp. 13323–13329.

Michel, H., et al., "The 2–D Crystalline Cell Wall of *Sulfolobus Acidocalderius*: Structure, Solubilization, and Reassembly," in *Electron Microscopy at Molecular Dimensions: State of the Art and Strategies for the Future*, Wolfgang Baumeister and Wolrad Vogell, eds, Springer–Verlag, Berlin, 1980, pp. 27–35.

Moore, Jon T. et al., "Controlled morphology of biologically derived metal nanopatterns," *Appl. Phys. Lett.*, vol. 71, No. 9, Sep. 1, 1997, pp. 1264–1266.

Murray, C.B. et al., "Synthesis and Characterization of Nearly Monodisperse CdE (E = S, Se, Te) Semiconductor Nanocrystallites," *J. Am. Chem. Soc.*, vol. 115, 1993, pp. 8706–8715.

Murray, C.B. et al., "Self–Organization of CdSe Nanocrystallites into Three–Dimensional Quantum Dot Superlattices," *Science*, vol. 270, No. 24, 1995, pp. 1335–1338.

Ohara, Pamela C. et al., "Crystallization of Opals from Polydisperse Nanoparticles," *Phys. Rev. Lett.*, vol. 75, No. 19, No. 6, 1995, pp. 3466–3469.

Ozin, Geoffrey A, Morphogenesis of Biomineral and Morphosynthesis of Biomimetic Forms, *Acc. Chem. Res.*, vol. 30, 1997, pp. 17–27.

Pearson, D.H. et al., "Nanochannel Glass Replica Membranes," *Science*, vol. 270, Oct. 6, 1995, pp. 68–70.

Pum, Dieter et al., "Anisotropic crystal growth of the S–layer of *Bacillus sphaericus* CCM 2177 at the air/water interface," *Colloids and Surfaces A: Physicochemical and Engineering Aspects*, vol. 102, 1995, pp. 99–104.

Pum, Dieter et al., "Molecular Nanotechnology and Biomimetics with S–Layers," in *Crystalline Cell Surface Proteins*, Academic Press and R. G. Landes Co., Austin, Texas, 1996, pp. 175–209.

Sleytre, Uwe B. et al., "Crystalline Surface Layers on Bacteria," *Ann. Rev. Microbiol.*, vol. 37, 1983, pp. 311–319.

Sleytr, Uwe B. et al., "Two–Dimensional Protein Crystals (S–Layers): Fundamentals and Application Potential," *Mat. Res. Soc. Symp. Proc.*, vol. 330, 1994, pp. 193–199.

St. John, Pamela M. et al., "Microcontact printing and pattern transfer using trichlorosilanes on oxide substrates," *Appl. Phys. Lett.*, vol. 68, No. 7, Feb. 12, 1996, pp. 1022–1024.

Taylor, K.A. et al., "Structure of the S–layer of *Sulfolobus acidocaldarius*," *Nature*, vol. 299, Oct. 28, 1982, pp. 840–842.

Weiss, Richard L., "Submit Cell Wall of *Sulfolobus acidocaldarius*," *J. Bacteriology*, Apr. 1974, pp. 275–284.

Whetten, Robert L. et al., "Nanocrystal Gold Molecules," *Adv. Mater.*, vol. 8, No. 5, 1996, pp. 428–433.

Wilbur, James L. et al., "Microfabrication by Microcontact Printing of Self–Assembled Monolayers," *Adv. Mater.*, vol. 6, No. 7/8, 1994, pp. 600–604.

* cited by examiner

After etching

TUNABLE NANOMASKS FOR PATTERN TRANSFER AND NANOCLUSTER ARRAY FORMATION

The U.S. government has a paid-up license in this invention and the right in limited circumstances to require the patent owner to license to others on reasonable terms, as provided for by the terms of the contracts numbered F49620-96-1-0007 and F4920-99-0105 awarded by the Air Force Office of Scientific Research.

BACKGROUND OF THE INVENTION

1. Field of the Invention

The present invention relates generally to a method for manufacturing an array of nanostructures and a substrate with an ordered array of nanostructures, wherein the nanostructure size is controlled. More particularly, the method forms an ordered array of nanoscale holes by etching a surface through a patterned mask containing a regular array of nanoscale pores and/or deposits adatoms on the surface through the patterned mask. Also, more particularly, the substrate includes a regular array of nanoscale holes and/or a regular array of nanoclusters comprising adatoms.

2. Description of Related Art

The ability to control function by controlling size makes nanoclusters very attractive for technological applications in high-speed computing, high density data storage and display, and optical communications through devices such as the single-electron transistor and the quantum dot laser. Designs for such devices require not only sharp control of nanocluster size, but also fabrication of ordered arrays of nanoclusters and, in some cases, interconnections between clusters within the array.

As has been discussed elsewhere (for example, J.-M. Gerard, 1995), single layer quantum dot arrays have been demonstrated to have excellent optical properties such as high quantum efficiency, long radiative lifetimes, and very fast PL rise times. However, direct growth has been stymied by "the prerequisite of an ultrafine lithographic definition of the mask."

Dramatic advances have been made recently in obtaining ordered arrays of nanoclusters from liquid phase syntheses by selective precipitation and Langmuir-Blodgett techniques (Murray et al. 1993; Ohara et al. 1995; Murray et al. 1995; Whetten et al. 1996; Luedtke et al. 1996; Heath et al. 1997). Ordered arrays have also been produced using films of close-packed polystyrene spheres as deposition masks (Hulteen et al. 1995). Ensembles of individual, size-controlled InP quantum dots grown by self-assembly in molecular beam lepitaxy on a GaAs surface have emitted light of very narrow bandwidth at a wavelength determined by the size of the dots (Grundmann et al. 1995); embedded between electron-injecting and hole-injecting layers, these dots have exhibited lasing (Kirstaedter 1996). However, because they grow at randomly distributed nucleation sites on the substrate, their location is difficult to control.

From the point of view of device fabrication, it is desirable to first define the desired nanoscale array pattern directly on the substrate and then grow or deposit the nanoclusters on the patterned substrate. The nanoclusters produced preferably have diameters less than about 25 nm to show true quantum confinement behavior.

In earlier work, Heath and co-workers (1996) studied the formation of clusters in confined geometries by defining 100 and 150 nm diameter holes in a thin oxide mask over a Si wafer and then growing Ge clusters on the Si surfaces exposed in the etched holes (Gillis et al. (1992)). They observed a few clusters in each 150 nm hole at locations distributed over the bottom of the hole. A few of the 100 nm holes contained a single cluster, but difficulties with that sample precluded complete analysis. Their results showed that the confining geometry of the 150 nm hole limited the number and size of clusters growing in the hole but did not precisely control their location.

Thus, there remains a need for a method of controlling the position as well as the size of arrayed nanoclusters.

REFERENCES

Bhatia, Suresh K. et al., "Fabrication of Surfaces Resistant to Protein Adsorption and Application to Two-Dimensional Protein Patterning," *Analytical Biochemistry,* Vol. 208, 1993, pp. 197–205.

Brock, Thomas D. et al., "Sulfolobus: A New Genus of Sulfur-Oxidizing Bacteria Living at Low pH and High Temperature," *Arch. Mikrobiol.* 84, Springer-Verlag, 1972, pp. 54–68.

Calvert, Jeffrey M. et al., "Deep Ultraviolet Lithography of Monolayer films with Selective Electroless Metallization," *J. Electrochem. Soc,* Vol. 139, June 1992, pp. 1677–1680.

Calvert., Jeffrey M. et. al., "Photoresist channel-constrained deposition of electroless metallization on ligating self-assembled films," *J. Vac. Sci. Technol. B,* Vol 6, November/December 1994, pp. 3884–3887.

Clark et al., U.S. Pat. No. 4,728,591, issued Mar. 7, 1986.

Clark et al., U.S. Pat. No. 4,802,951, issued Feb. 7, 1989.

Deatherage, J. F. et al., "Three-dimensional Arrangement of the Cell Wall Protein of *Sulfolobus acidocaldarius,*" *J. Mol. Biol.,* Vol. 167, 1983, pp. 823–852.

Douglas, Kenneth et al., "Nanometer Molecular Lithography," *Appl. Phys. Lett.,* Vol. 48, No. 10, Mar. 10, 1986, pp. 676–678; correction in *Appl. Phys. Lett.,* Vol. 48, No. 26, Jun. 30, 1986, p. 1812.

Douglas, Kenneth et al., "Transfer of Biologically Derived Nanometer-Scale Patterns to Smooth Substrates," *Science,* Vol. 257, Jul. 31, 1992, pp. 642–644.

Gérard, Jean-Michel et al., "Prospects of High-Efficiency Quantum Boxes Obtained by Direct Epitaxial Growth," in *Confined Electrons and Photons: New Physics and Applications,* Elias Burstein and Claude Weisbuch, eds., Plenum Press, New York, 1995, pp. 357–381.

Gillis, H. P. et al., "Low-energy electron beam enhanced etching of Si(100)-(2×1) by molecular hydrogen," *J. Vac. Sci. Technol B,* Vol. 10, No. 6, November/December 1992, pp. 2719–2733.

Gillis, H. P. et al., "Low energy electron-enhanced etching of Si(100) in hydrogen/helium direct-current plasma," *Appl. Phys. Lett.,* Vol 66, No. 19, May 8, 1995, pp. 2475–2477.

Gillis et al., U.S. Pat. No. 5,917,285, issued Jun. 29, 1999.

Grogan, Dennis W., "Phenotypic Characterization of the Archaebacterial Genus Sulfolobus: Comparison of Five Wild-Type Strains," *J. Bacteriology,* Vol. 471, No. 12, December 1989, pp. 6710–6719.

Grundman, M. et al., "Ultranarrow Luminescence Lines from Single Quantum Dots," *Phys. Rev. Lett.,* Vol. 74, No. 20, May 15, 1995, pp. 4043–4046.

Harrison, Christopher et al., "Lithography with a mask of block copolymer microstructures," *J. Vac. Sci. Technol. B,* Vol. 16, No. 2, March/April 1968, pp. 544–552.

Heath, J. R. et al., "Spatially Confined Chemistry: Fabrication of Ge Quantum dot Arrays," *J. Phys. Chem.,* Vol. 100, 1996, pp. 3144–3149.

Heath, James R. et al, "Pressure/Temperature Phase Diagrams and Superlattices of Organically Functionalized Metal Nanocrystal Monolayers: The Influence of Particle Size, Size Distribution, and Surface Passivant," *J. Phys. Chem. B*, Vol. 101, 1997, pp. 189–197.

Hulteen, John C. et al., "Nanosphere lithography: A materials general fabrication process for periodic particle array surfaces," *J. Vac. Sci. Technol. A*, Vol. 13, No. 3, May––June 1995, pp. 1553–1558.

Jackman, Rebecca J. et al., "Fabrication of Submicrometer Features on Curved Substrates by Microcontact Printing," *Science*, Vol. 279, Aug. 4, 1995, pp 664–666.

Kim, Enoch et al., "Combining Patterned Self-Assembled Monolayers of Alkanethiols on Gold with Anisotropic Etching of Silicon to Generate Controlled Surface Morphologies," *J. Electrochem. Soc.*, Vol. 142, No. 2, February 1995, pp. 628–632.

Kirstaedter, N. et al., "Gain and differential gain of single layer InAs/GaAs quantum dot injection lasers," *Appl. Phys. Lett.*, Vol. 69, No. 9, Aug. 26, 1996, pp. 1226–1228.

Kumar et al., "Features of gold having micrometer to centimeter dimensions can be formed through a combination of stamping with an elastomeric stammp and an alkanethiol "ink" followed by chemical etching," *Appl. Phys. Lett.*, Vol. 63, No. 14, Oct. 4, 1993, pp. 2002–2004.

Kumar, Amit et al., "Patterning Self-Assembled Monolayers: Applications in Materials Science," *Langmuir*, Vol. 10, 1994, pp. 1498–1511.

Lembcke, G. et al., "Image analysis and processing of an imperfect two-dimensional crystal: the surface layer of the archaebacterium *Sulfolobus acidocaldarius* re-investigated," *J. Microscopy*, Vol. 161, Pt. 2, February 1991, pp. 263–278.

Lercel, M. J. et al., "Sub-10 nm lithography with self-assembled monolayers," *Appl. Phys. Lett.*, Vol. 68, No. 11, Mar. 11, 1986, pp. 1504–1506.

Luedtke, W. D. et al., "Structure, Dynamics, and Thermodynamics of Passivated Gold Nanocrystallites and Their Assemblies," *J. Phys. Chem.*, Vol. 100, No. 32, Aug. 8, 1996, pp. 13323–13329.

Martin et al., U.S. Pat. No. 5,882,538, issued Mar. 16, 1999.

Martin et al., U.S. Pat. No. 6,027,663, issued Feb. 22, 2000.

Martin et al., U.S. Pat. No. 6,013,587, issued Mar. 7, 2000.

Michel, H., et al., "The 2-D Crystalline Cell Wall of *Sulfolobus Acidocaldarius*: Structure, Solubilization, and Reassembly," in *Electron Microscopy at Molecular Dimensions: State of the Art and Strategies for the Future*, Wolfgang Baumeister and Wolrad Vogell, eds, Springer-Verlag, Berlin, 1980, pp. 27–35.

Moore, Jon T. et al., "Controlled morphology of biologically derived metal nanopatterns," *Appl. Phys. Lett.*, Vol. 71, No. 9; Sep. 1, 1997, pp. 1264–1266.

Murray, C. B. et al., "Synthesis and Characterization of Nearly Monodisperse CdE (E=S, Se, Te) Semiconductor Nanocrystallites," *J. Am. Chem. Soc.*, Vol. 115, 1993, pp. 8706–8715.

Murray, C. B. et al., "Self-Organization of CdSe Nanocrystallites into Three-Dimensional Quantum Dot Superlattices," *Science*, Vol. 270, Nov. 24, 1995, pp. 1335–1338.

Ohara, Pamela C. et al., "Crystallization of Opals from Polydisperse Nanopartaicles," *Phys. Rev. Lett.*, Vol. 75, No. 19, Nov. 6, 1995, pp. 3466–3469.

Ozin, Geoffrey A, "Morphogenesis of Biomineral and Morphosynthesis of Biomimetic Forms,*Acc. Chem. Res.*, Vol. 30, 1997, pp. 17–27.

Pearson, D. H. et al., "Nanochannel Glass Replica Membranes," *Science*, Vol. 270, Oct. 6, 1995, pp. 68–70.

Pum, Dieter et al., "Anisotropic crystal growth of the S-layer of *Bacillus sphaericus* CCM 2177 at the air/water interface," *Colloids and Surfaces A: Physicochemical and Engineering Aspects*, Vol. 102, 1995, pp. 99–104.

Pum, Dieter et al., "Molecular Nanotechnology and Biomimetics with S-Layers," in *Crystalline Cell Surface Proteins*, Academic Press and R. G. Landes Co., Austin, Tex., 1996, pp. 175–209.

Sleytr, Uwe B. et al., "Crystalline Surface Layers on Bacteria," *Ann. Rev. Microbiol.*, Vol. 37, 1983, pp., 311–319.

Sleytr, Uwe B. et al., "Two-Dimensional Protein Crystals (S-Layers): Fundamentals and Application Potential," *Mat. Res. Soc. Symp. Proc.*, Vol. 330, 1994, pp. 193–199.

St. John, Pamela M. et al., "Microcontact printing and pattern transfer using trichlorosilanes on oxide substrates," *Appl. Phys. Lett.*, Vol. 68, No. 7, Feb. 12, 1996, pp. 1022–1024.

Taylor, K. A. et al., "*Structure of the S-layer of Sulfolobus acidocaldarius,*" *Nature*, Vol. 299, Oct. 28, 1982, pp., 840–842.

Weiss, Richard L., "Subunit Cell Wall of *Sulfolobus acidocaldarius,*" *J. Bacteriology*, April 1974, pp. 275–284.

Whetten, Robert L. et al., "Nanocrystal Gold Molecules," *Adv. Mater.*, Vol. 8, No. 5, 1996, pp. 428–433.

Wilbur, James L. et al., "Microfabrication by Microcontact Printing of Self-Assembled Monolayers," *Adv. Mater.*, Vol. 6, No. 7/8, 1994, pp. 600–604.

SUMMARY

The present invention, provides a method for producing substrates, wherein single nanoclusters are formed in regular arrays. By etching holes an order of magnitude smaller in diameter than those of Heath et al. (1996), we have observed the formation of a single nanocluster in each hole when Ti adatoms are deposited on a Si substrate that has been etched to define an array of nanometer-sized holes. The symmetry and lattice constant of the array, as determined by atomic force microscopy (AFM), are identical to those of the etched holes, demonstrating that these extremely small holes control the position as well as the number of 5 clusters grown in each hole.

It is an object of the present invention to provide new nanopattern mask materials which allow formation of nanostructures having controlled diameters without the slow throughput of electron beam lithography and the high cost of X-ray lithography.

It is another object of the present invention to provide new nanopattern masks which intrinsically contain mesoscopic scale openings.

It is a further object of the present invention to provide a process for creating nanostructures combining the steps of obtaining a biologically derived mask, transferring the mask pattern to a substrate using low-damage dry etching under conditions that control the size of the transferred pattern features, and initiating cluster growth by adatom deposition.

It is still another object of the present invention to achieve massively parallel processing in fabricating an ordered and precisely positioned array of nanoclusters of controlled size.

It is yet another object of the present invention to create arrays of holes having controlled diameters small enough to induce the formation of nanoclusters which exhibit quantum confinement behavior without causing adjacent lattice damage to the substrate.

One embodiment of the present invention comprises a method for preparing masks having ordered arrays of nanoscale pores. The method comprises the steps of providing a mask template having a structure including an ordered array of nanoscale pores, mounting the mask template on a substrate, and at least partially coating the mask template with an etch/deposition mask such that the etch/deposition mask has a pre-selected effective pore diameter different from the pore diameter of the mask template. Preferably, the mask template is of biological origin. The providing step may comprise culturing an organism which synthesizes a material having a structure suitable for use as the mask template and isolating the cultured material. A preferred organism is a bacterium of the genus Sulfolobus.

The mounting step may comprise forming a suspension of a plurality of the mask templates in a liquid, applying the suspension to a surface of the substrate, and removing the liquid from the surface. A surfactant may be added to alter the ability of the liquid to wet the surface.

The coating step may comprise forming the etch/deposition mask by applying a coating from a direction other than normal to said mask template. The coating step may comprise applying a coating from a direction selected to provide an annulus of said coating within the pores of said mask template or applying a coating from a direction selected to provide a larger effective pore diameter in the etch/deposition mask than the diameter of the pores of the mask template.

An etch mask formed in accordance with the present invention, having ordered arrays of nanoscale pores, may comprise a material selected from titanium, chromium, vanadium, tungsten, and combinations thereof.

In yet another embodiment, the present invention comprises a method for fabricating ordered arrays of nanoscale features. The method comprises the steps of providing a mask template having a structure including an ordered array of nanoscale pores, at least partially coating the mask template with an etch mask material to form an etch mask having a pre-selected effective pore diameter different from the pore diameter of the mask template, and using the etch mask for performing at least one operation on a substrate, wherein the operation is selected from depositing material on the substrate and removing material from the substrate based on the locations of the pores. Preferably, the mask template is obtained from bacteria of the genus Sulfolobus. The etch mask may comprise a material selected from titanium, chromium, vanadium, tungsten, and combinations thereof. The mask template and the etch/deposition mask may have a pore spacing between about 3 and about 30 nm, and the nanoscale features may have a diameter varying from about 1 to about 30 nm. The coating step may comprise controlling the effective pore diameter of the etch/deposition mask by applying a coating from a direction other than normal to the mask template. The direction may be selected to provide an annulus of said coating within the pores of said mask template or to provide a larger effective pore diameter in the etch/deposition mask than the diameter of the pores of the mask template, and the method comprises the additional step of removing material from around the pores of the mask template.

In another embodiment, the present invention comprises an ordered array of nanoscale features, formed by the method comprising the steps of providing a mask template having a structure including an ordered array of nanoscale pores, at least partially coating the mask template with an etch mask material to form an etch mask having a different effective pore diameter than the pore diameter of the mask template, and using the etch mask for performing at least one operation on a substrate, wherein the operation is selected from depositing material on the substrate and removing material from the substrate based on the locations of the pores.

In another embodiment, the present invention comprises an ordered array of nanoscale features, formed by the method comprising the steps of providing a patterning mask having a structure including an ordered array of nanoscale pores, at least partially coating the patterning mask with an etch mask material to form an etch mask having a different effective pore diameter than the pore diameter of the patterning mask, and using the etch mask for performing at least one operation on a substrate, wherein the operation is selected from depositing material on the substrate and removing material from the substrate based on the locations of the pores.

BRIEF DESCRIPTION OF THE DRAWINGS

These and other features, aspects, and advantages of the present invention will become better understood with reference to the following description, appended claims, and accompanying drawings, where:

FIG. 8(*b*) is a higher magnification HRXTRM image of a protein crystal/metal oxide masked Si exposed only to LE4 etching, showing Si lattice fringes;

FIG. 9(*b*) is an AFM image of a sample processed as in (a) but without the oxygen plasma exposure, with the white arrow showing a single hexagon of holes and the inset showing a Fourier transform of the image;

DETAILED DESCRIPTION

It should be noted that all references cited in this Detailed Description are incorporated herein by reference, in their entirety.

In accordance with the present invention, we have used new methods of nanofabrication to produce ordered arrays of holes having diameters in the range of about 1 to about 30 nm and ordered arrays of single nanoclusters having diameters of about 5 nm. These nanoclusters can be produced via a highly scaleable method for the inexpensive, parallel fabrication of dense, ordered arrays of semiconductor quantum dots that can serve in single layers as the emissive elements in active layers of electroluminescent devices, such as flat panel displays, ultrathin displays deployed on flexible substrates, and vertical-cavity surface-emitting lasers (VCSELs). The dots or holes within an array have a highly uniform size and spacing, arising naturally from the inherent order of the nanometer-scale masks employed to create the quantum dots. The formation of the dot arrays can proceed in a very straightforward way using a highly selective dry etching process followed by conventional molecular beam epitaxy. Moreover, the technique does not require a strain field or complex growth kinetics as are often employed in multilayer quantum dot designs for VCSELs.

Figure 1:
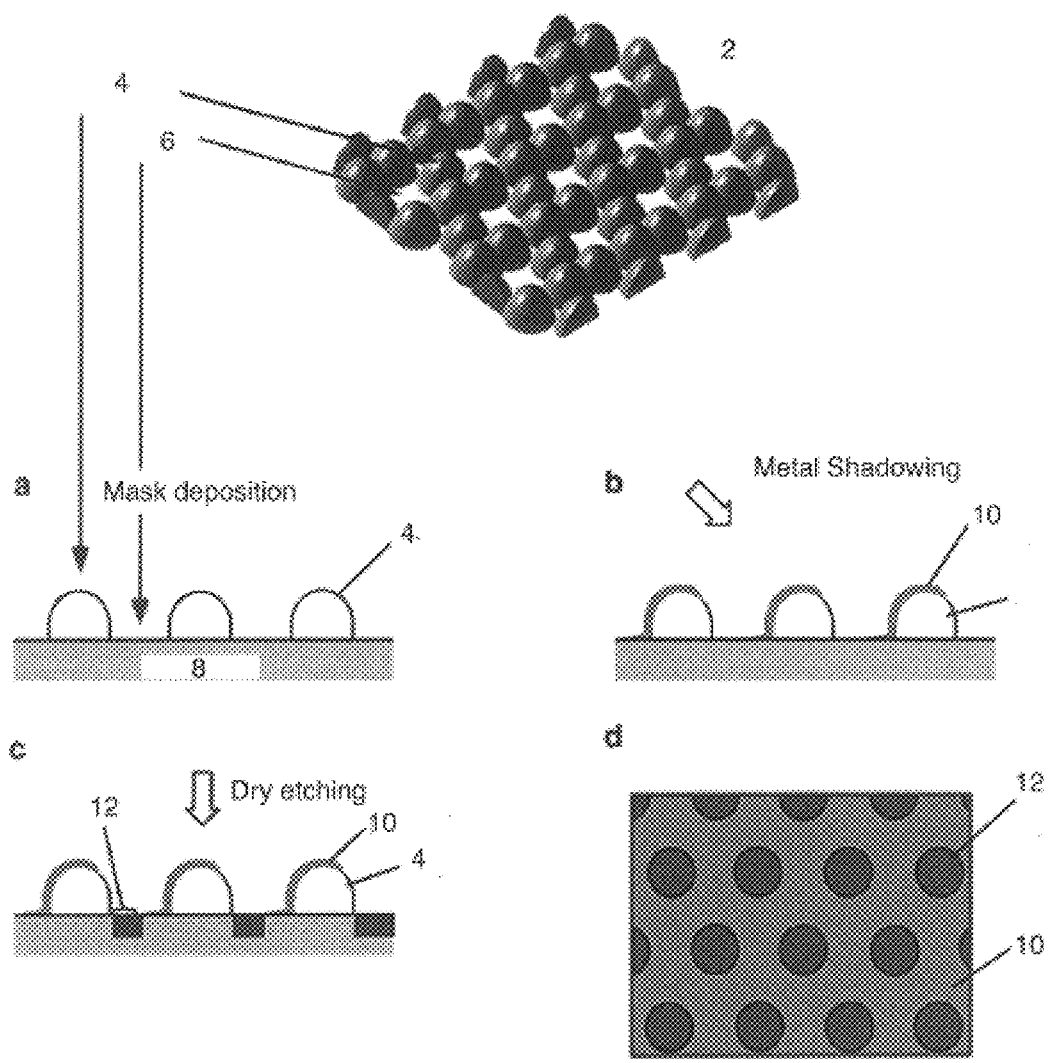
FIG. 1 is a schematic representation of (A) S-layer deposition, (B) metallization, (C) low-damage etching for pattern formation, and (D) an idealized plan-view of the final mask.

The combination of nanofabrication process steps is shown schematically in FIG. 1. The steps include obtaining a mask 2 comprising a material 4, having a regular array of pores 6; mounting the mask 2 on a substrate surface 8; forming a thin metal or metal oxide layer 10 on the mounted mask 2; and pattern transfer onto the substrate surface 8 by low damage etching. Nanoclusters, such as quantum dots, can be grown on the patterned substrate by adatom as deposition. This method has collectively achieved massively parallel processing in fabricating an ordered and precisely positioned array of nanoclusters. Alternatively, pattern transfer onto the substrate could occur by adatom deposition, without the etching step.

Such parallel processing methods are analogous to the optical lithography and wide area etching used routinely today in microfabrication and are highly desirable to ensure the manufacturability of nanostructures and to realize thereby the technological promise offered by devices in the nano regime.

In one embodiment, we used LE4 etching as described in Gillis et al. (1995) in a DC hydrogen plasma to transfer an hexagonal array of 18 nm diameter holes with a 22 nm lattice constant from a biologically derived mask into Si (100), as described in Clark et al. U.S. Pat. No. 4,728,591, issued Mar. 7, 1986 and incorporated herein by reference in its entirety; Douglas et al. (1986); Clark et al. U.S. Pat. No. 4,802,951, isssued Feb. 7, 1989 and incorporated herein by reference in its entirety; and Douglas et al. (1992). LE4 etching, unlike reactive ion etching (RIE), can etch features smaller than 25 nm without damage to the remaining material in the substrate, allowing control of the surface chemistry of the etched surfaces and, consequently, the morphology of subsequently deposited materials. After etching, the mask was removed, and the patterned surface was intentionally oxidized in an oxygen plasma. Deposition of 1.2 nm of Ti on the oxidized surface produced an ordered array of 5 nm diameter metal nanoclusters positioned at the etched hole sites.

Also in accordance with the present invention, it has been demonstrated that sufficiently small nanometer-scale patterns on a surface can control nucleation and growth of materials deposited on that surface and can produce an ordered array of nanoclusters in which each cluster is precisely located at a position determined a priori. Arrays of wells have been etched, and a single nanocluster has been formed in each of the etched wells by self-organization of deposited adatoms. The symmetry and lattice constant of the array are identical to those of the etched wells, demonstrating that these extremely small wells control the position as well as the number of clusters grown in each well. Further, the etched wells are small enough to reduce the diffusion field of adatoms within the holes so severely that subsequent nucleation is suppressed after the first cluster has formed in each well.

Using a biological protein crystal which already incorporated nanometer-scale features to generate the mask allowed the fabrication of structural features a factor of two smaller than those defined by standard lithographic processes. Further, the slow steps of defining the nanostructures by serial lithography may be avoided.

In accordance with the present invention, any material which comprises a sheet-like structure and incorporates a regular, repeating array of holes can be used as a mask for formation of nanostructures. For example, inorganic molecules having a porous crystal structure, such as zeolite-type compounds, could be used. Alternatively, a thin film of diblock copolymers could be created with an array of nanometer-scale holes, as described in Harrison et al. (1998). Another type of mask could be formed by drawing a group of glass capillaries out until the inner diameters are of nanometer-scale dimensions, as described in Pearson et al. (1995). Also, masks can be generated by using other naturally occurring materials similar to those used here (Pum et al. (1996), by modifying naturally occurring masks such as those described in Moore et al. (1997), by using chemical self-assembly such as that described in Kim et al. (1995) and Jackman et al. (1995), or by using biomimetic growth methods such as those described in Ozin et al. (1997).

A preferred type of mask is a crystalline material of biological origin. For example, some species of bacteria have a two-dimensional crystalline protein layer which forms the external surface of the membranes of the bacteria. This layer is known as the S-layer, and it has regularly spaced pores. S-layers exist with a variety of lattice constants between about 3 and about 30 nm; different symmetries, such as square, hexagonal, and oblique; and varying pore diameters (Sleytr et al. (1983)).

Two strains of bacteria from the genus Sulfolobus are preferred have been found useful: *Sulfolobus acidocaldarius* and *Sulfolobus solfataricus,* both of which have hexagonal pore arrays. *Sulfolobus solfataricus* was isolated from a hot spring in Italy growing at pH 3.5–5 and at a temperature of 87° C. *Sulfolobus acidocaldarius* was isolated from a hot spring in Yellowstone National Park, as described in Brock et al. (1972). Because the S-layers that these bacteria produce are so periodic and remain stable in such harsh conditions, we have employed them as mask templates.

The S-layer of the bacteria *Sulfolobus acidocaldarius* comprises crystals having an hexagonal array of pores 5 nm in diameter with a lattice constant of 22 nm. Although the symmetry of the protein and the pores is more properly labeled trigonal because there are three groups of protein dimers around each pore, the symmetry will hereinafter be referred to as hexagonal (See, for example, Taylor et al. (1982); Deatherage et al. (1983); and Lembcke et al. (1991)). The protein making up the crystal is a glycoprotein of molecular weight 140 kD. The cytoplasmic side of the S-layer, the side that faces the inside of the bacterium, is sculpted, while the exoplasmic side, the side facing away from the bacterium, is relatively smooth with carbohydrate chains hanging off. Crystalline samples have been prepared by the inventors with dimensions of about 1–2 $\mu$m; other workers have reported samples as large as 50 $\mu$m in extent.

It is preferable to obtain clean, isolated S-layers for use as mask templates. Usable S-layers are preferably free of contamination which might block the pores; they preferably yield fragments which can be deposited onto a substrate without clumping or sticking together; and they preferably yield fragments that retain the S-layer's natural stability, with edges that remain intact and do not fray or fall apart. It should be noted that the parameters that produce the fastest and most abundant bacterial growth do not necessarily result in the cleanest S-layers.

It is preferable to obtain clean, isolated S-layers for use as patterning masks. Usable S-layers are preferably free of contamination which might block the pores; they preferably yield fragments which can be deposited onto a substrate without clumping or sticking together; and they preferably yield fragments that retain the S-layer's natural stability, with edges that remain intact and do not fray or fall apart. It should be noted that the parameters that produce the fastest and most abundant bacterial growth do not necessarily result in the cleanest S-layers.

A new culture may be started either from cells that have been frozen at liquid nitrogen temperature, from freeze-dried cells, or from a small aliquot of live cells from a recent culture. All of the growth media described in Examples 1 and 14 can support growth if inoculated with cells from a frozen culture or from a recently grown culture. However, if a culture is being started from a freeze-dried pellet, we have found that Growth Medium 6 is preferred for getting growth started. Once the initial culture has begun growing, the cells can be transferred to another medium. It has been found that Growth Medium 1 produces S-layers that best satisfy the constraints listed above.

The point at which the cells are harvested is extremely important. When the growth rate slows and the growth curve is observed to fall away from the linear projection, cells begin to die. When the cells die, they lyse and contaminate the medium with denaturing proteins, which can be sticky, and with proteases, enzymes which attack proteins. At the same time, the acidic medium flows into the cell which normally remains at a pH near 7. This acidic medium can cross-link material to the S-layer. Once cross-linked to the S-layer, this material may not be removed later in the isolation process.

Figure 2:
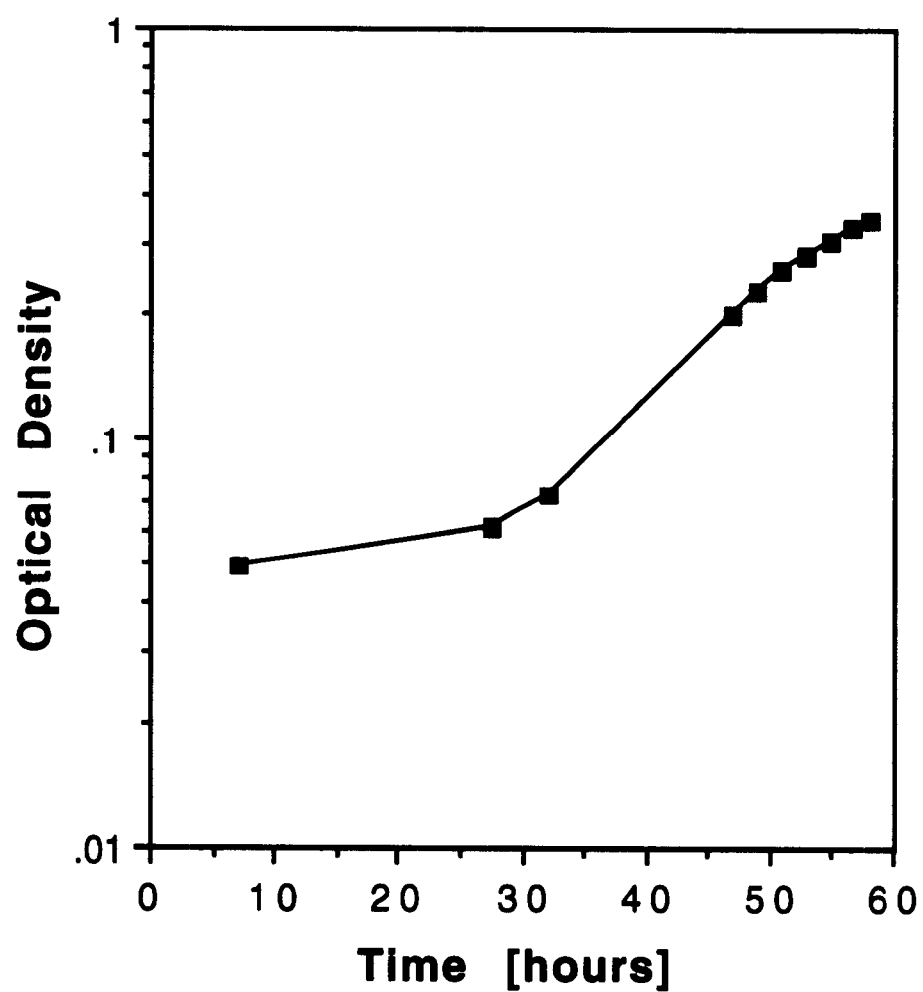
FIG. 2 is a graph of optical density at 420 nm versus time for a typical *Sulfolobus acidocaldarius* culture in Growth Medium 1 growing at 75° C.

The optical density (OD) of the culture gives a good measurement of the extent of growth of the bacteria. FIG. 2 shows a typical growth curve for *Sulfolobus acidocaldarius* in Growth Medium 1. The bacteria grow exponentially for some time, producing a linear growth curve when plotted on a logarithmic scale. As nutrients decrease and waste products increase, the growth slows, and the growth curve starts to fall away from the earlier linear behavior. The bacteria are harvested when this fall off is observed. In Growth Medium 1, *Sulfolobus acidocaldarius* starts this fall off at $OD_{420\ nm} \cong 0.35$. Therefore, it is desirable to harvest the bacteria before the $OD_{420\ nm}$ increases much above 0.35.

To allow use of the nanometer-scale, periodic pattern of the S-layer, the S-layer is preferably isolated intact from the cells. Many isolation protocols have been developed, such as those described in Weiss (1974); Michel (1980); and Grogan (1989).

*Sulfolobus acidocaldarius* is a lobed or roughly spherical bacterium. The isolation procedure leaves the S-layer protein as intact sacculi, or whole sacs. For use in accordance with the present invention, the sacculi are preferably broken up into fragments that can lie flat on a substrate.

An attractive way to improve S-layer quality is to solubilize the protein crystal and recrystallize it. All S-layers are held together by differing combinations of non-covalent bonds (hydrophobic bonds, ionic bonds, and hydrogen bonds) (Sleytr and Messner (1983)). Chaotropic agents such as guanidine hydrochloride or urea may solubilize S-layers held together by hydrogen bonds. Once the S-layer is solubilized into protein monomers, the S-layer protein may be collected, separated from all contaminants, and allowed to recrystallize by removing the disrupting agent. In fact, Michel et al. (1980) used three different methods to solubilize and reassemble the S-layer from *Sulfolobus acidocaldarius*. Furthermore, recrystallization has the added advantage that it can be used to obtain perfect (defect-free) crystals much larger than those isolated from bacteria. Sleytr et al. (1994) have recrystallized perfect S-layer crystals 20 $\mu$m in diameter. The recrystallized S-layers were even strong enough to span 10 $\mu$m holes in a "holey" carbon film without breaking. It may be possible to create "designer S-layers" in which the recrystallization is directed by a patterned substrate to yield protein crystals of a designed shape and size.

Referring again to FIG. 1, the substrate surface 8 may be cleaned prior to depositing one or more masks 2. For substrate materials such as highly ordered pyrolytic graphite (HOPG) or mica, the top surface can be cleaved away leaving an atomically flat, clean surface. For materials like silicon, the surface is preferably cleaned using a chemical cleaning solution to remove contaminating organics and hydrocarbons.

For application of S-layers to a substrate, the surface preparation preferably fulfills three requirements. First, the S-layer should be adsorbed onto the substrate with the cytoplasmic side up. Therefore, the substrate surface is preferably primed to attract the exoplasmic side. Second, the attraction is preferably strong enough to keep the adsorbed S-layers from being moved significantly by the water as it evaporates. And finally, the surface preferably yields monolayer patches if the correct concentration of S-layers is applied.

Hydrophilic surfaces are ideal for S-layer adhesion. The drop of water in which the S-layers are suspended will wet a hydrophilic surface completely, thereby ensuring a good coverage of S-layers. Also, most of the water can be wicked off, such as with a piece of filter paper, leaving a thin film of water behind. The surface of this film will move almost vertically as the water evaporates, ensuring that the S-layers stay dispersed as they adsorb onto the surface.

If the surface is hydrophobic, the drop of water in which the S-layers are suspended will not wet the surface but will form a hemispherical drop, and consequently, the coverage of S-layers on the surface will be poor. More importantly, as the water evaporates, the drop will shrink in size, and the sides of the drop will move parallel to the surface. The surface tension of the water will drag the S-layers with it, creating a pile of S-layers centered at the point where the drop evaporates. However, addition of a surfactant to the aqueous suspension may decrease the suface tension sufficiently to enhance the ability of the suspension to wet a hydrophobic surface.

An oxygen plasma may be employed to create a surface even more hydrophilic than the one created by chemical cleaning. The substrate can be exposed to a DC oxygen plasma at a pressure of 20 mTorr, a potential of about 1.5 kV, and a current of 20 mA for 2 minutes. An added advantage of oxygen plasma cleaning is that it can be used in conjunction with fairly hydrophobic surfaces, such as photoresist. The oxygen plasma can be used to remove the top layer of the resist and leave behind a more hydrophilic surface which improves S-layer adhesion.

The following discussion refers to the formation of titanium nanoclusters on a silicon substrate. However, it should be noted that titanium and silicon are described as examples of materials that can be used in accordance with the present invention, and nanoclusters of other materials, such as germanium and silicon, could be deposited on other substrates, using chemical reactions known to those skilled in the art. Indeed, any material could be used that can be deposited to form nanoclusters that exhibit desired properties, such as quantum confinement.

Silicon substrates generally have a native 2–5 nm thick $SiO_2$ surface layer, which may increase in thickness with chemical cleaning. However, certain etch processes require a minimal $SiO_2$ thickness. For these processes, after chemical cleaning, the substrates may be dipped in buffered hydrofluoric acid (HF) to remove the $SiO_2$ layer and then oxygen plasma cleaned to produce an oxide layer approximately 2 nm thick.

Once a surface is cleaned, it can be further modified. For example, a silicon substrate surface may be modified with an organosilane to create a self-assembled monolayer (SAM). This SAM becomes the new surface of the substrate, supplanting the chemical properties of the original surface with the properties of the functional group on the organosilane. SAM's have the added advantage that they can be used to create a pattern on the surface because the functional group can be cleaved with 193 nm light. These patterns can be used for selective deposition of metals, protection against wet chemical etchants, and selective adsorption of biological materials (see for example, Calvert et al. (1992), Bhatia et al. (1993), Kumar and Whitesides (1993), Calvert et al. (1994), Kumar et al. (1994), Wilbur et al. (1994), Kim et al. (1995), Lercel et al. (1996), and St. John and Craighead (1996)).

Silanes may also be used to promote adhesion of S-layers to noble metal substrates such as gold. However, the absence of a native oxide on noble metal substrates prevents the use of alkyl silanes because the siloxane linkages cannot be formed. Therefore, it is preferable to use silanes bond to the substrate by another mechanism. The preferred silane for noble metal substrates is one which contains a mercapto group (an SH). The mercapto groups preferably chelate the metal atoms and bond the silane to the surface. To get a good monolayer coverage, the mercapto silane is preferably applied by vapor deposition.

To make a sample, the S-layers can be deposited in a drop of water onto the substrate of choice. In general, a majority of the water is removed, and the S-layers adsorb onto the surface of the substrate as the remaining water evaporates. It is preferable to dry the substrate by a method which ensures that the S-layers remain as dispersed monolayers on the substrate and that the structure of the S-layer is distorted as little as possible. Suitable drying methods include air drying and use of alcohol solutions with varying ratios of alcohol/water, and critical point drying.

If the pattern of the mask is to be transferred to the substrate, the mask preferably has a surface suitable for use with the method selected to transfer the pattern to the substrate surface. For processes such as LE4 etching, a preferred mask surface comprises a thin layer of $TiO_2$, which may be deposited on the S-layer or other porous crystalline template after mounting the S-layer on the substrate surface. Once the S-layer has been metallized, the mask is completed. Other fine-grained metals, such as chromium, vanadium, tungsten, and combinations thereof, are also preferred masking materials. FIG. 1B illustrates a metal or metal oxide layer 10 deposited on an S-layer 4.

The pattern of the mask can be transferred to the substrate in various ways, shown schematically in FIG. 1, where hole sites 12 correspond to pore sites 6 in protein mask 4. Preferred methods of pattern transfer include low energy dry etching methods, such as LE4 etching, which is especially well suited for etching nanopatterns defined by thin or delicate mask materials, and inductively coupled plasma (ICP) etching. Alternatively, material could be deposited by a suitable method on the substrate surface, without etching holes in the substrate.

Following pattern transfer, the mask may be stripped from the substrate. For example, a metal oxide/protein crystal mask formed with bacterial S-layer material can be stripped from the sample with a 1:1 solution of $H_2SO_4$:$H_2O_2$ at 130° C.

After the mask is removed from the substrate, nanoclusters can be formed in the arrayed holes, or wells, on the substrate surface by suitable means, depending on the substrate composition and the desired nanocluster composition.

These nanoclusters may function as quantum dots. The diameter of the nanoclusters can be selected by varying the effective diameter of the pore sites when the mask template is transformed into an etch mask. For example, it may be desirable to control the diameter of quantum dots and, hence, the wavelength of the dots' emission. The pore diameter can be changed by using a mask template with a different pore size, or by altering the angle at which the ultrathin metal layer is deposited to the mask template. The angle of deposition of the metal overlayer applied to the S-layer determines the effective pore diameter of the mask and thus the size of the nanoclusters which will be fabricated. Therefore, a single choice of S-layer mask template can be used to form multiple, distinct etch masks which then enable formation of different diameter nanoclusters, and, hence, different emissive wavelengths in a finished device.

Figure 3:
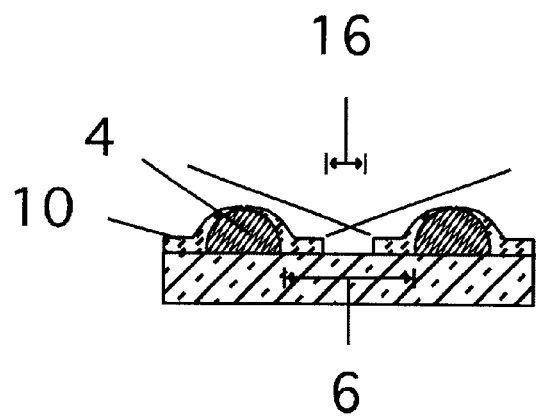
FIG. 3 is a schematic illustration of a method for decreasing the effective pore diameter of a nanomask in accordance with the present invention.
Figure 4:
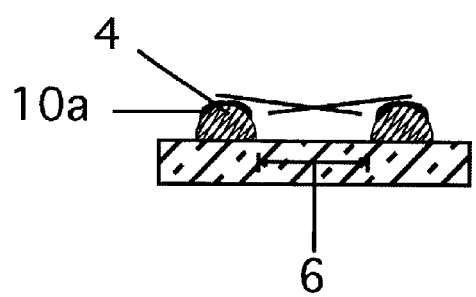
FIG. 4 is a schematic illustration of a method for increasing the effective pore diameter of a nanomask in accordance with the present invention.
Figure 4:
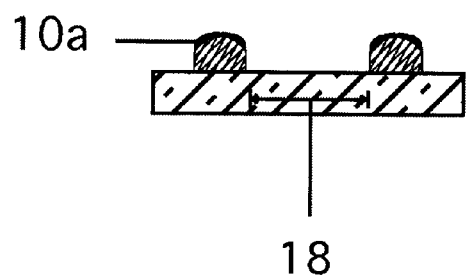

As shown in FIGS. 3 and 4, a metal overlayer 10 can be deposited at an angle other than at normal incidence. In this case, it is desirable that the sample rotates with respect to the metal source (or vice versa) to provide for non-unidirectional deposition of metal. As illustrated in FIG. 3, a suitable choice of angle, determined by the aspect ratio of the protein crystal pore structure, will create a metal annulus 16 within each pore 6 of the nanomask, effectively shrinking the mask aperture size. This will allow the creation of smaller diameter nanoclusters than would be possible if only the original pore diameter were available as an etch mask.

In the case illustrated in FIG. 4, a metal layer 10*a* can be rotary shadowed onto a nanomasked substrate at a highly oblique or grazing angle of incidence. In this instance, the metal layer 10a will coat a portion of the protein nanomask 4 outside the pore sites 6 and above the level of the nanomask material which is in the immediate periphery of the pore sites 6. The nanomask material in the immediate periphery of the pore sites and not coated by the metal can be readily removed, for example, using an oxygen plasma. Thus, apertures 18 in the nanomask may be created which are larger in diameter than the pore sites that existed prior to the modification brought about by the highly oblique metal deposition. This allows the creation of larger diameter nanoclusters than would be possible if only the original pore diameter were available for use as an etch mask. When viewed collectively, the modifications to the initial nanomask material described above provide the ability to "tune" the nanomask and, hence, to change the size of the nanoclusters to be produced.

The following nonlimiting examples are provided to further illustrate the invention.

EXAMPLE 1
Growth of S-layer Producing Bacteria

A volume of *Sulfolobus acidocaldarius* was used to inoculate Growth Medium 1 in a ratio of 1:10 inoculant-:growth medium. The culture was incubated at 70–75° C. in an incubator shaker until the $O.D._{420}$ reached 0.35, or for about 48–65 hours.

Growth Medium 1 was prepared as follows:

| GROWTH MEDIUM 1 | |
| --- | --- |
|  | per liter |
| $K_2SO_4$ | 3.00 g |
| $(NH_4)_2SO_4$ | 1.00 g |
| $NaH_2PO_4$ | 0.50 g |
| $MgSO_4$ | 0.15 g |
| $CaCl_2.2H_2O$ | 0.10 g |

When ready to use the medium, the following was added, and the solution was brought to pH=3.4 with sulfuric acid.
Xylose 2.00 g

EXAMPLE 2
Harvesting the Bacteria

A modified version of the procedure used by Michel et al. (1980) was followed to isolate S-layer. The cells were harvested by centrifugation at 10,410×g for 20 minutes. The supernatant was discarded, and the resulting pellets were resuspended in an 10 mM HEPES (N-[2-Hydroxyethyl] piperazine-N'-[2-ethanesulfonic acid]) solution. HEPES is a buffer that can maintain the pH and help to prevent proteins from being denatured. The cells were collected again by a 20 minute, 10,410×g centrifugation and resuspended in a 150 ml, 10 mM HEPES solution. These two centrifugation steps "washed" the cells and removed most of the growth medium and miscellaneous debris.

EXAMPLE 3
S-layer Isolation

After stirring the suspended cells from Example 2 for a few minutes to ensure that the cells are free-floating in the mixture, 0.23 g of Sodium Dodecyl Sulfate (SDS) was added to make a 0.15% solution which was stirred for 5 minutes. SDS is a strong ionic detergent which solubilizes lipid layers and denatures some proteins. It can pass through the pores in the S-layer and solubilize the cell membrane, releasing the cytoplasm into the solution.

Next, a small amount of an enzyme, DNAse I [Sigma, D4527] was added as a sloid from the tip of a spatula to solubilize the DNA. Magnesium must be present for the DNAse to function, so a small amount was added in the form of magnesium chloride (0.08 g $MgCl_2$) to activate the DNAse. The solution was heated to 37° C. and stirred for 1 hour.

The lysed cells were then collected by a 10 minute, 29,756×g centrifugation, and the pellet was resuspended in 10 ml of distilled water in a 15 ml conical tube. A small amount of Pronase (Sigma, catalog no. P-5147) was added from the tip of a spatula, and the mixture was incubated at 40° C. for 1 hour. This step solubilized any protein that might have protected the DNA from the DNAse. The Pronase was then removed by two 10 minute, 20,190×g centrifugations, and the pellet was resuspended in distilled water. After the second spin, the pellet was resuspended in 10 ml of distilled water in a 15 ml conical tube. A small amount of DNAse and 0.01 g of $MgCl_2$ were added and incubated at 40° C. for 1 hour. The DNAse was removed by two 10 minute, 20,190×g centrifugations, and the pellet was resuspended in distilled water. After the second spin, the pellet was resuspended in 50 ml of distilled water. This solution was then added to a 150 ml solution containing 0.48 g HEPES and 4 g SDS to yield a 200 ml solution of 10 mM HEPES and 2% SDS by weight. The solution was then stirred for 24 hours at room temperature. This step solubilized the plasma membrane and all proteins with the exception of the S-layer protein and a few "tough" transmembrane proteins.

After the 24 hour incubation, the S-layers were collected by a 15 minute, 29,756×g centrifugation. The pellets were resuspended in a small amount of distilled water and added to a 60° C., 2% SDS solution and stirred for 1 hour. This step removed the remaining proteins, leaving only the S-layer protein which was collected by a 15 minute, 29,756×g centrifugation. The supernatant was discarded, and the pellets were resuspended in a small amount of distilled water. This centrifugation/resuspension process was repeated at least 3 times until all of the SDS and as much as possible of the remaining random contaminants had been removed. The final pellet was resuspended in approximately 3.5 ml of distilled water and stored at 4° C. until needed.

EXAMPLE 4
Breaking Up Intact S-layer Sacs

The whole S-layer sacs in the final suspension from Example 3 were broken into smaller fragments by sonication. To sonicate the whole sacs, 1 ml of the whole sac suspension was placed in a cryovial which in turn was placed in a beaker filled with crushed ice. The ice prevented the S-layers from being heated significantly by the sonication. Using a Branson Sonicator with the microtip piezo attached and the power output set at 1 and the duty cycle set at 50%, the sacs were sonicated for four cycles of 20 seconds of sonication and 10 seconds of rest.

The fragments were separated by size with differential centrifugations, progressively longer and faster. The first centrifugation lasted 15 minutes at 11,950×g. The resulting pellet was labelled A, and contained predominantly whole sacs that were not broken up. The supernatant was again centrifuged at 11,950×g for 30 minutes to yield a second pellet, labelled B. The supernatant was then centrifuged again at 11,950×g for 30 minutes to yield a third pellet, labelled C. Finally, the supernatant was centrifuged at 47,800×g for 30 minutes to yield a fourth pellet, labelled D. All pellets were resuspended with 200–400 μl of distilled water and stored at 4° C. The B and C pellets contained S-layer fragments of about 1–1.5 microns in size, which were useful as masks for subsequent experiments. The D pellet included only tiny fragments of S-layer.

EXAMPLE 5
Substrate Preparation

A silicon (100) substrate was cleaned in a 3:7 solution of $H_2O_2:H_2SO_4$ at 60° C. for 15 min. Native $SiO_2$ was removed from the sample surface with a buffered oxide etch, and the sample was placed in oxygen plasma for 2 min at 20 mtorr $O_2$, 1.5 kV, and 20 mA to create a new, thinner hydrophilic $SiO_2$ surface suitable for adsorbing the protein crystals from Example 4.

EXAMPLE 6
Deposition of S-layers on a Substrate Surface, Using Air Drying

A 4×4 mm piece of silicon (100) is prepared as described in Example 5. A 6 µl drop of S-layers suspended in distilled water is placed on the silicon surface. After 20 or 30 seconds, a piece of filter paper is touched to the side of the silicon piece so that it comes in contact with the water drop. The filter paper is held in place until no more water can be removed from the surface. The silicon surface is hydrophilic, and a thin film of water remains on the surface of the silicon. This water is then allowed to evaporate in air. This method is the drying method of choice when the sample has been cleaned with an oxygen plasma, as described in Example 5.

EXAMPLE 7
S-layer Deposition on Hydrophobic Surfaces

A 4×4 mm piece of silicon (100) was prepared as described in Example 5, except that this sample was not plasma etched. S-layers were suspended in a solution of 0.014% by volume Triton X-100, a surfactant, in distilled water. A 6 µl drop of S-layers suspended in the detergent solution distilled water was placed on the silicon surface. The S-layers were deposited uniformly on the substrate, with minimal residue after drying.

EXAMPLE 8
S-layer Metallization

A sample was prepared as described in Example 5. The protein crystals deposited on the prepared silicon surface were coated with titanium at a rate of 0.1 nm s$^{-1}$ at an angle 40° from normal incidence by electron beam evaporation. The average titanium thickness was 1.2 nm, as measured using a calibrated quartz crystal monitor in the deposition system. The amount of titanium deposited, and thus the ultimate thickness of the mask, was limited by the need to avoid blocking the pores when the oxide forms.

Figure 5:
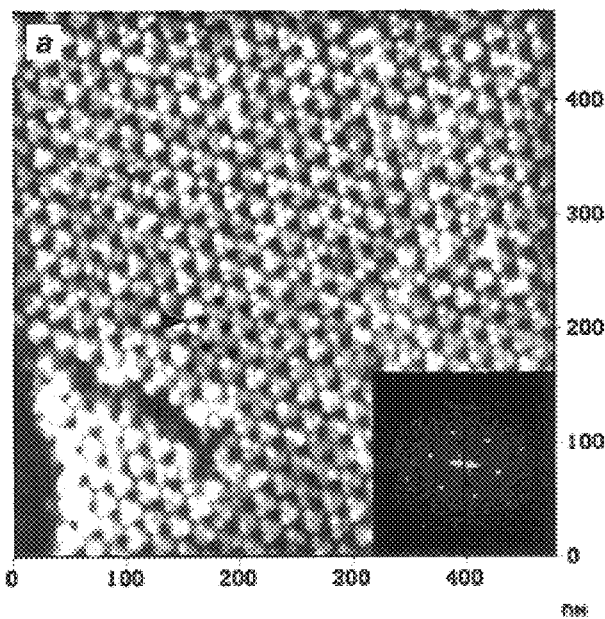
FIG. 5 is an AFM image of an S-layer coated with 12 Å of Ti in accordance with the present invention, with the arrow pointing to a hexagonal group of holes, appearing as dark spots, and the inset showing a Fourier transform of the image, with the six spots indicating the hexagonal symmetry.

The titanium film was then oxidized by exposure to air. The titanium oxide thickness was measured to be 3.5 nm by AFM and confirmed by spectroscopic ellipsometry. The metallized pore diameter was about 6 nm. An AFM image of a metallized S-layer is shown in FIG. 5. Once the S-layer has been metallized, the mask is completed.

EXAMPLE 9
LE4 Etching

A silicon substrate was prepared with a metal oxide/protein crystal mask as described in Example 8. Because the $TiO_2$ mask was much thinner than standard masking materials used in microfabrication processes, it was susceptible to removal during standard ion-based dry etching. The entire The sample was LE4 etched in the anode glow of a DC plasma at 100 mtorr of pure hydrogen at 50 sccm gas flow and room temperature. The sample was maintained at the floating potential of the plasma during the etching process. The mask pattern was transferred to the silicon substrate by LE4 etching using the methods described in U.S. Pat. Nos. 5,882,538; 5,917,285; 6,027,663; and 6,033,587.

EXAMPLE 10
Stripping the Mask from the Substrate

Figure 6:
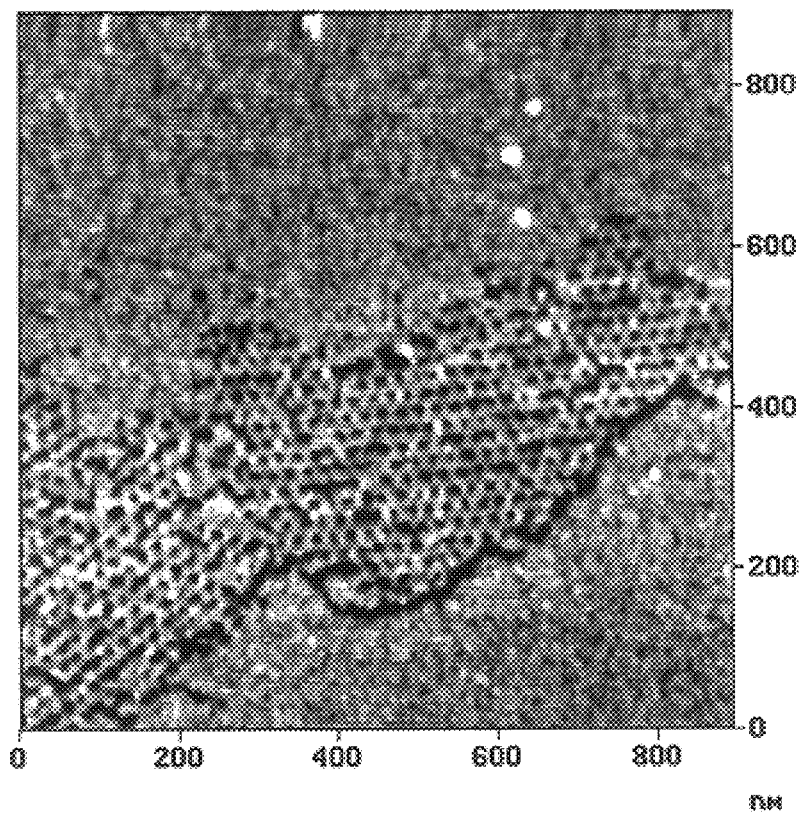
FIG. 6 is an AFM image of the bare LE4 etched Si surface after a protein crystal/metal oxide mask has been removed from the surface.

Following pattern transfer by LE4 etching, the metal oxide/protein crystal mask formed with bacterial S-layer material was stripped from the silicon substrate by exposure to a 1:1 solution of $H_2SO_4:H_2O_2$ at 130° C. for 1 hour. XPS measurements after stripping showed that the $TiO_2$ was completely removed. The $SiO_2$ layer was removed by dipping the sample in buffered HF for 30 s, rinsing with distilled water, and blowing dry with $N_2$. Atomic force microscopy (AFM) of the bare Si surface revealed a hexagonal array of holes with a lattice constant of 22 nm, identical to the lattice constant of the protein crystal lattice used for patterning the surface, as shown in FIG. 6.

Together, these results demonstrate unambiguously that the biologically-derived nanopattern was transferred into the Si(100) crystal by LE4 etching.

EXAMPLE 11
Atomic Force Microscopy of Surfaces

Figure 7:
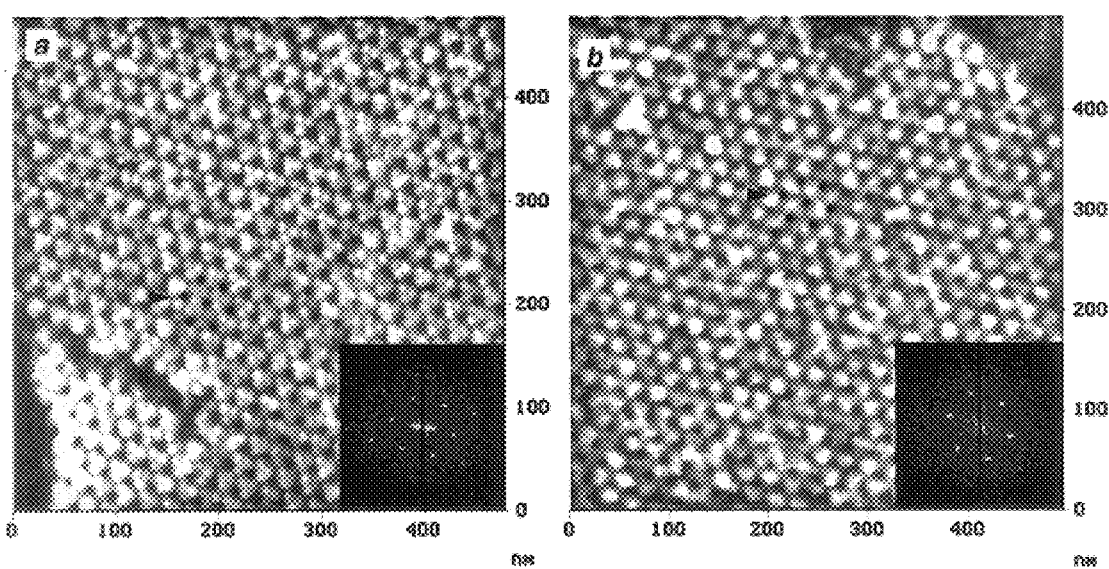
FIG. 7 shows AFM images of metallized protein crystals on Si (100) (a) before and (b) after LE4 etching; the insets are Fourier transforms of the hexagonal symmetry of the pattern highlighted by the black arrows in the main images.

Sample surfaces were imaged by AFM before and after etching, as shown in FIG. 7. The AFM probe consists of a sharp tip extending from the underside and end of a cantilever. A laser is reflected off the top of the cantilever and directed to a set of photodetectors. As the tip is scanned across the surface, changes in surface topography and composition produce forces on the tip which deflect the cantilever as a result of the sum of the forces acting upon the tip. These forces include the fluid film damping force at a tip-sample separation of approximately 10 µm; electrostatic forces which can be attractive or repulsive at 0.1–1 µm; the fluid surface tension force at a distance of 10–200 nm from the sample surface; and weak attractive Van der Waals forces a distance of about an Ångstrom above the surface. When the cantilever is deflected, the laser spot on the photodetectors moves. From these deflections, the AFM computer generates an image of the surface topography as the tip is scanned across the surface.

The correlation between the image constructed by the AFM and the actual topography of the sample is not straightforward. In general, features that protrude from the surface are broadened, and features that are recessed into the surface appear narrower than they actually are. If the actual hole has a smaller diameter than the end of the tip, the AFM tip cannot fit into the hole and never comes in contact with the bottom of the hole. The typical radius of curvature for a $SiN_4$ tip is 40–50 nm; the typical radius of curvature or an etched Si tip is 5–10 nm. Because the holes in the S-layer pattern are approximately 5 nm in diameter, even the sharpest etched Si tips cannot provide any data bout the bottom of the holes after the pattern has been etched into the substrate. Moreover, if the tip is mechanically prevented from reaching the bottom of the holes, we cannot measure their depth with AFM.

In FIG. 7, height of the surface features is represented by brightness in the AFM images; therefore, the holes in the S-layer are the dark areas, such as those indicated by the arrows. The hexagonal symmetry of the pattern is clearly evident in both images and in the Fourier transforms shown in the inserts. Because the diameters of the holes were comparable to the diameter of the AFM tip, the depth of the etched holes could not be measured by AFM. Therefore, another technique is needed to measure the depth of these narrow holes in the etched samples, which is about 10–20 nm.

EXAMPLE 12
High Resolution Cross-sectional Transmission Electron Microscopy (HRXTEM)

High resolution cross-sectional transmission electron microscopy (HRXTEM) was used to supplement the information obtained by AFM as well as to determine the depth of the holes. To perform HRXTEM, the sample must be cross sectioned and then thinned to less than 100 nm in thickness and examined with transmission electron microscopy (TEM). By viewing the nanostructured samples in cross-section, the hole depths and thickness of the various layers in the system, such as oxide layers, damage layers, etc., can be measured.

Figure 8:
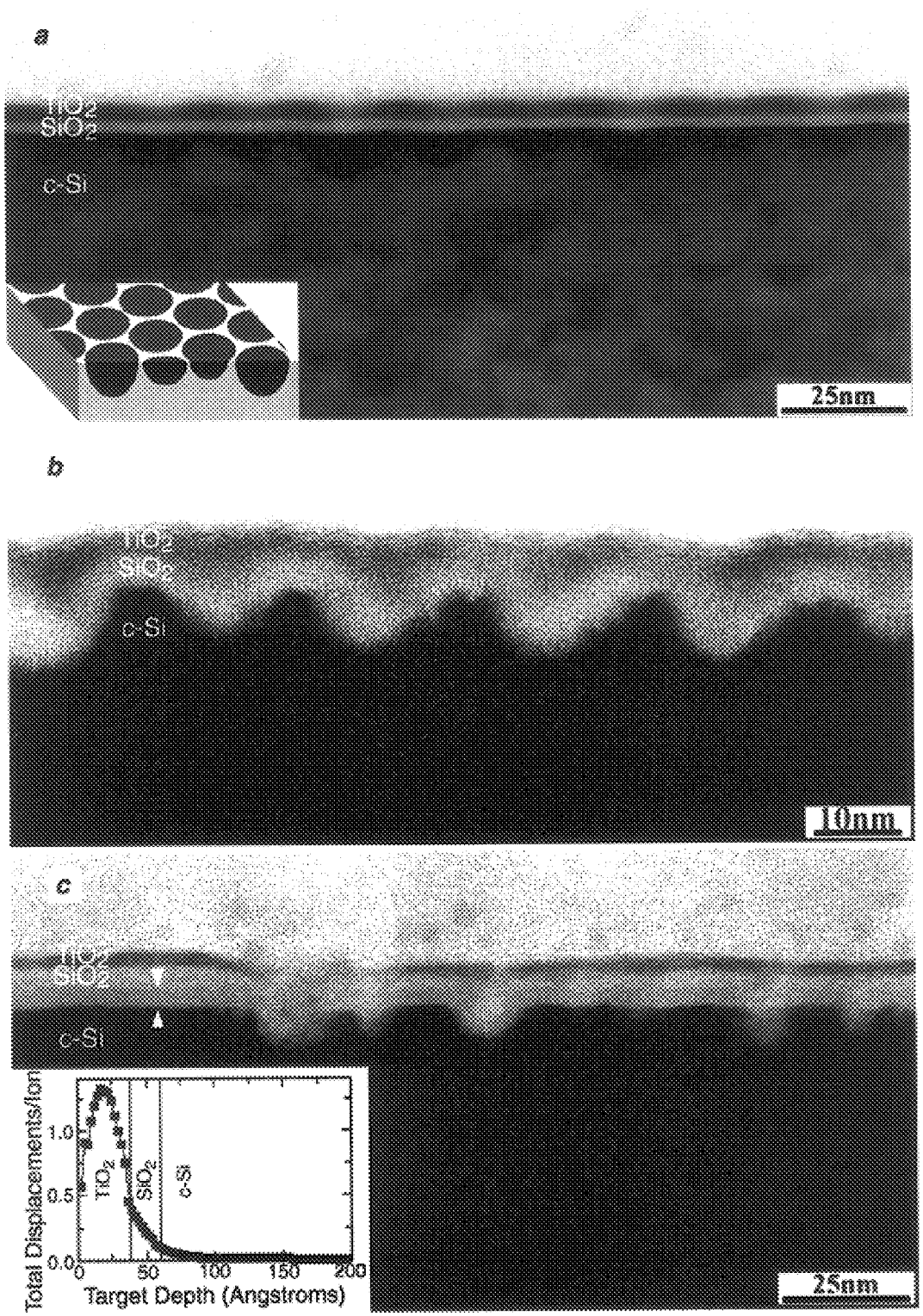
FIG. 8(*a*) is a high resolution cross-sectional transmission electron micrograph (HRXTRM) image of a protein crystal/metal oxide masked Si exposed only to LE4 etching, with the inset showing the schematically the result of an arbitrary cross-section of an ordered surface.

FIG. 8a shows a low magnification view of an area of the sample patterned by LE4 etching. Because the cross-section is at in arbitrary orientation relative to the rows of etched holes, inhomogeneities in the pattern and missing holes may appear in the image, as represented schematically in the inset to FIG. 8a. Comparing the deepest holes, in the TEM image with fully cross-sectioned holes in the inset shows that the periodic nanometer-scale pattern of the protein crystal mask has been etched into the silicon lattice to a depth of 10 nm.

In FIG. 8a, the holes in the mask appear as periodic light areas in the $TiO_2$ layer. The etched holes below them are hemispherical and clearly undercut the mask. The isotropic etching widens the holes to a diameter of 18 nm. In previous experiments, Si (100) patterned by LE4 etching on a micrometer length scale with metal and with dielectric masks showed etch directionality of various degrees, from vertical sidewalls to classical isotropic undercut, depending on the etch conditions. These earlier results suggest that the present biologically-derived nanopatterns can be transferred into Si (100) with a broad range of controlled etch profiles. A series of such patterned surfaces would reveal effects of the etched feature's curvature on subsequent formation of nanoclusters on the etched surface.

FIG. 8b shows a high magnification view of an area etched by LE4. Lattice fringes clearly evident around the holes demonstrate that the holes were etched through the native $SiO_2$ layer beneath the protein mask and into the crystalline Si without the lattice displacement damage typically caused by conventional ion beam and plasma etch methods.

To compare the effects of LE4 etching and ion milling on the Si lattice, a sample masked with metal oxide/protein crystal prepared as above was ion milled with 2 keV $Ar^+$ ions at a current density of 7 $\mu A$ cm-2 for 12 min prior to exposure to LE4 etching. FIG. 8c shows a low magnification TEM image of this sample. The patterned holes have been broadened, and a subsurface region 2 nm thick has been rendered amorphous. The corresponding penetration depth (about 100 A) agrees with TRIM calculations (see inset to FIG. 8c) for 2 keV $Ar^+$ ions incident from the normal direction on a similar system. The absence of this subsurface damage layer in the sample exposed only to LE4 etching demonstrates that LE4 etching does not inflict lattice damage.

EXAMPLE 13
Formation of Nanoclusters on Etched Surfaces

Figure 9:
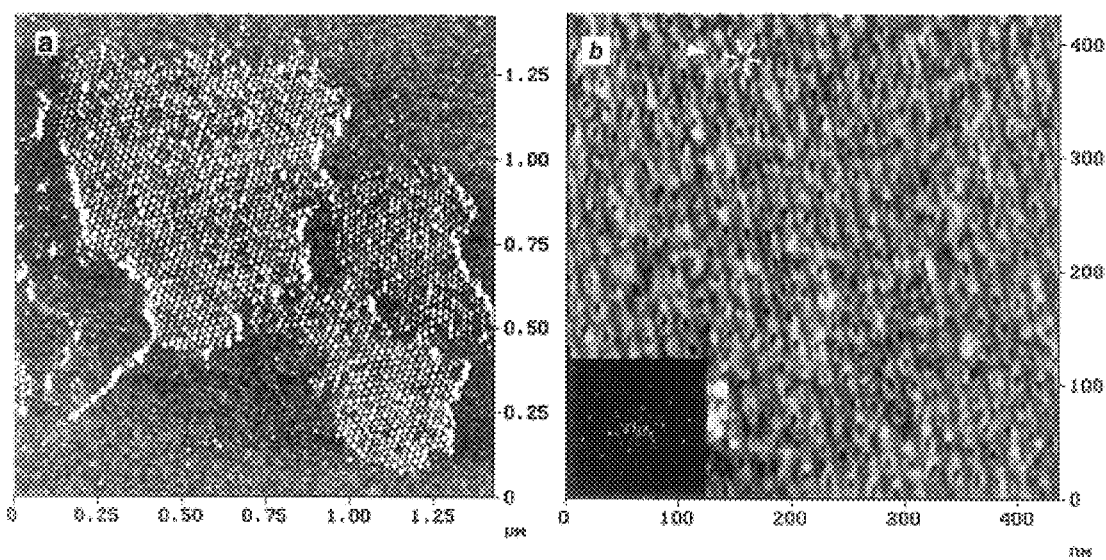
FIG. 9(*a*) is an AFM image of a nanocluster array formed on an LE4 etched surface by electron beam evaporation of titanium after an oxygen plasma exposure.

After the mask was removed from the substrate, nanoclusters were formed in the arrayed wells on the substrate surface. A sample of Si(100) sample was prepared as described in Example 6 and patterned by LE4 etching as described in Example 9. The mask was removed as in Example 10. The $SiO_2$ layer was left intact, and the sample was cleaved into two pieces. One piece was exposed to a DC oxygen plasma for 30 s at 20 mtorr, 1 keV, and about 8 mA. The second piece was not exposed to oxygen plasma. 1.2 nm of titanium is then deposited by electron beam evaporation at normal incidence on each piece. Upon examination with AFM, the piece exposed to oxygen plasma revealed ordered arrays of nanoclusters about 5 nm in diameter with the same symmetry and lattice constant as the protein crystal (FIG. 9a). The piece not exposed to oxygen plasma showed no evidence of nanoclusters (FIG. 9b).

In FIG. 9a, each cluster is detected by AFM as a protrusion above the surrounding surface. Because the distance between the clusters is comparable with, and likely smaller than, the diameter of the AFM tip, it is impossible to obtain a detailed high magnification image showing the shape, the periphery, and the substrate surface around each cluster. Increasing the magnification in FIG. 9a only produces a blurred image and provides no further structural details.

EXAMPLE 14
Growth of S-layer Producing Bacteria in Other Media

The following growth media were each innoculated with *Sulfolobus acidocaldarius,* as described in Example 1.

| GROWTH MEDIUM 1 "XG Medium" | |
|---|---|
| | per liter |
| $K_2SO_4$ | 3.00 g |
| $NaH_2PO_4$ | 0.50 g |
| $MgSO_4$ | 0.15 g |
| $CaCl_2.2H_2O$ | 0.10 g |

When ready to use medium, add the following and then bring to pH=3.4 with sulfuric acid.

Xylose 2.00 g

L-Glutamine 1.00 g

| GROWTH MEDIUM 3 "XCAA Medium" | |
|---|---|
| | per liter |
| $K_2SO_4$ | 3.00 g |
| $NaH_2PO_4$ | 0.50 g |
| $MgSO_4$ | 0.15 g |
| $CaCl_2.2H_2O$ | 0.10 g |

When ready to use medium, add the following and then bring to pH=3.4 with sulfuric acid.

Xylose 2.00 g

Casein, acid hydrolysates 1.00 g

| GROWTH MEDIUM 4 "Grogan's Medium" | |
|---|---|
| | per liter |
| $K_2SO_4$ | 3.00 g |
| $NaH_2PO_4$ | 0.5 g |
| $MgSO_4$ | 0.15 g |

GROWTH MEDIUM 4
"Grogan's Medium"

| | per liter |
|---|---|
| $CaCl_2.2H_2O$ | 0.10 g |
| Trace Minerals | |

When ready to use medium, add Tryptone and then bring to pH=3.0 with sulfuric acid Tryptone 2.00 g

GROWTH MEDIUM 5
"Mary's Medium"

| | per liter |
|---|---|
| $(NH_4)_2SO_4$ | 1.30 g |
| $KH_2PO_4$ | 0.28 g |
| $MgSO_4$ | 0.25 g |
| $CaCl_2$ | 0.07 g |
| $FeCl_3$ | 0.02 g |
| Yeast Extract | 1.00 g |
| Solution A (stirred well) | 1.00 ml |
| Solution D | 0.01 ml |

Bring to pH=2.3 with sulfuric acid and autoclave.

| Solution A: | |
|---|---|
| $MnCl_2$ | 0.18 g |
| $Na_2B_4O_7$ | 0.45 g |
| $ZnSO_4$ | 0.22 g |

Bring volume to 100 ml with distilled $H_2O$ and store at 4° C.

| Solution B: | |
|---|---|
| $CuCl_2$ | 0.50 g |
| $NaNO_3$ | 0.30 g |
| $CoSO_4$ | 0.10 g |

Bring volume to 100 ml with distilled $H_2O$ and store at 4° C.

GROWTH MEDIUM 6
"ATCC 1723 Medium"

| | per liter |
|---|---|
| $(NH_4)_2SO_4$ | 1.3 g |
| $KH_2PO_4$ | 0.28 g |
| $MgSO_4$ | 0.12 g |
| $CaCl_2.2H_2O$ | 0.07 g |
| $FeCl_3.6H_2O$ | 0.02 g |
| Tryptone | 1.00 g |
| Yeast Extract | 0.05 g |

GROWTH MEDIUM 6
"ATCC 1723 Medium"

| | per liter |
|---|---|
| Solution A (stirred well) | 1.00 ml |
| Solution B | 0.01 ml |

Bring to pH=3.0 with sulfuric acid and autoclave.

| Solution A: | |
|---|---|
| $MnCl_2.4H_2O$ | 0.90 g |
| $Na_2B_4O_7.10H_2O$ | 4.25 g |
| $ZnSO_4.7H_2O$ | 0.11 g |

Bring volume to 500 ml with distilled $H_2O$ and store at 4° C.

| Solution B: | |
|---|---|
| $CuCl_2.2H_2O$ | 0.50 g |
| $NaNO_3.2H_2O$ | 0.30 g |
| $VOSO_4.2H_2O$ | 0.30 g |
| $CoSO_4.7H_2O$ | 0.18 g |

Bring volume to 100 ml with distilled $H_2O$ and store at 4° C.

GROWTH MEDIUM 7
"Allen's Medium"

| | per liter |
|---|---|
| $(NH_4)_2SO_4$ | 1.30 g |
| $KH_2PO_4$ | 0.28 g |
| $MgSO_4$ | 0.12 g |
| $CaCl_2$ | 0.06 g |
| Yeast Extract | 1.00 g |

Bring to pH=3.0 with sulfuric acid and autoclave.

All of the tested media supported significant bacterial growth.

EXAMPLE 15
Preparation of Nanomasked Templates on Hydrophobic Si

A silicon (100) substrate was cleaned in a 3:7 solution of $H_2O_2$:$H_2SO_4$ at 60° C. for 15 minutes. Native $SiO_2$ was removed using 10 percent HF in H2O at room temperature for 30 seconds. S-layers were prepared as described in Examples 1–4 and suspended in a solution of dilute (<0.01% by volume Triton X-100 (Sigma) in distilled water. The use of oxide-free nanomasked samples improved the quality and speed of the LE4 etch process.

EXAMPLE 16
Nanomasks with Tuned Pore Diameters

Layers of titanium were prepared on carbon coated 400-mesh transmission electron microscope (TEM) grids. These samples were rotary shadowed at various angles and with varying thicknesses of titanium. The metal overlayer provided the contrast difference needed to identify and measure the "effective" diameter of the pores. Because the titanium layers are ultrathin, the Ti oxidized completely. The volume expansion that occurs when the oxide formed could not be ignored. It was known from prior experiments that a 1.2 nm Ti layer will increase in thickness to 3.5 nm of $TiO_2$ when exposed to air, as measured by AFM and independently confirmed by spectroscopic ellipsometry. Thus, to create the appropriate annulus diameter in the etch mask, it was necessary to carefully determine the thickness of Ti needed, taking into account empirically the expected lateral 'overgrowth' resulting from oxidation and the shadowing angle at which the Ti was deposited.

To increase the pore diameter of the etch mask by shadowing at very oblique incidence, leaving the protein around the periphery of the pore uncovered, an oxygen plasma was used to remove the uncovered protein. This left a pore in the metal overlayer which had a diameter greater than the original pore in the S-layer.

Figure 10:
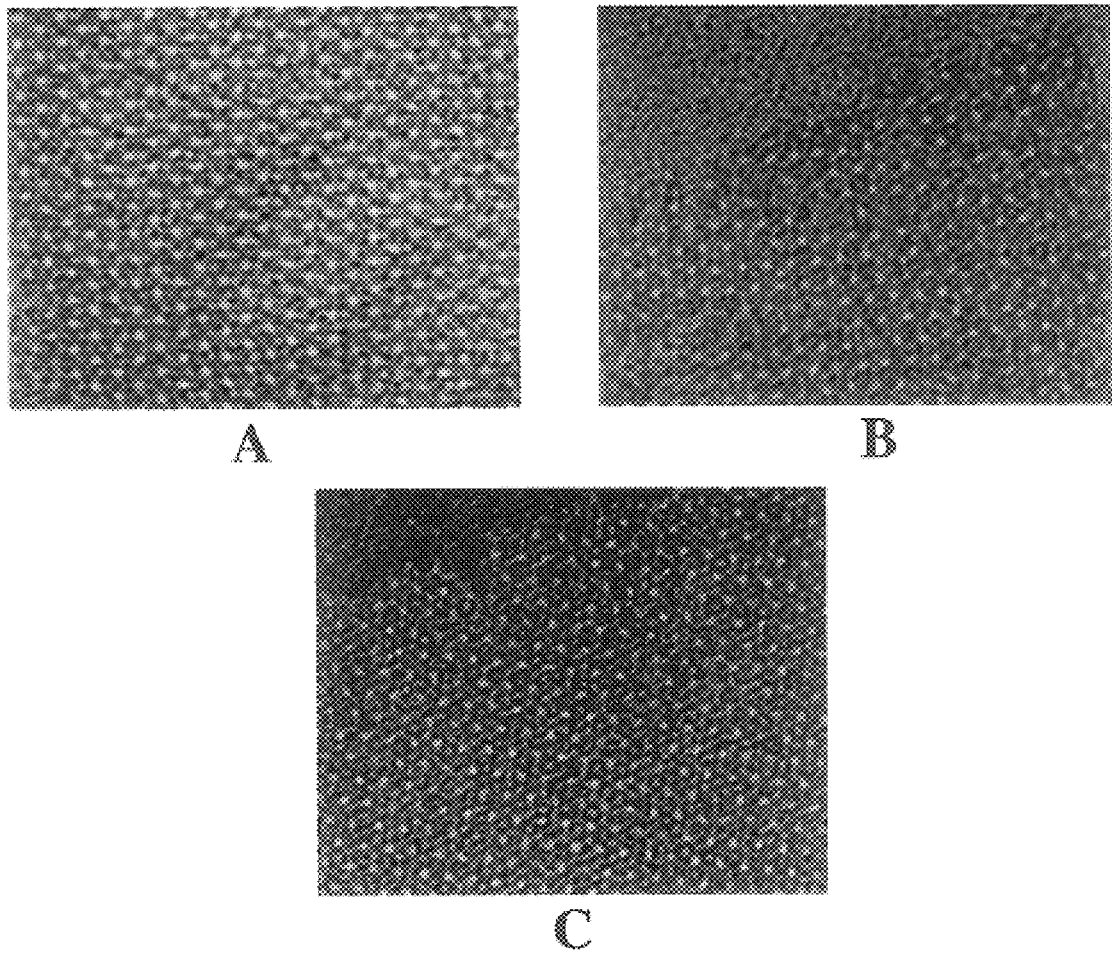
FIG. 10 is TEM images of S-layers that have been rotary-shadowed with Ti at (A) 70°, (B) 65°, and (C) 60° from normal, in accordance with the present invention.

The diameters of the pores with altered diameters were measured using TEM. The results are shown in FIG. 10 for rotary deposition of titanium at angles of 70° (A), 65° (B), and 60° (C). Because Ti is not deposited onto the substrate at the center of the pore ites (see FIG. 4), these areas appear bright. It can be seen that the aperture diameters change as the metal deposition angle is changed.

The ability to "tune" the mask aperture diameter enables control of the diameter of the etched holes in the substrate. This control of the hole diameter, essentially control of the diffusion field, allows control of the diameter of the quantum dots for a variety of dot materials.

EXAMPLE 17
Micron-scale Lithography for Device Development

As shown in Examples 8–13, sufficiently small nanometer-scale patterns on a surface can control nucleation and growth of materials deposited on that surface and produce an ordered array of quantum dots in which each dot is precisely located at an a priori determined position. The position of each array is determined by the placement of the S-layers. To incorporate the arrays of dots into devices, it is preferable to be able to position the S-layers precisely.

Figure 11:
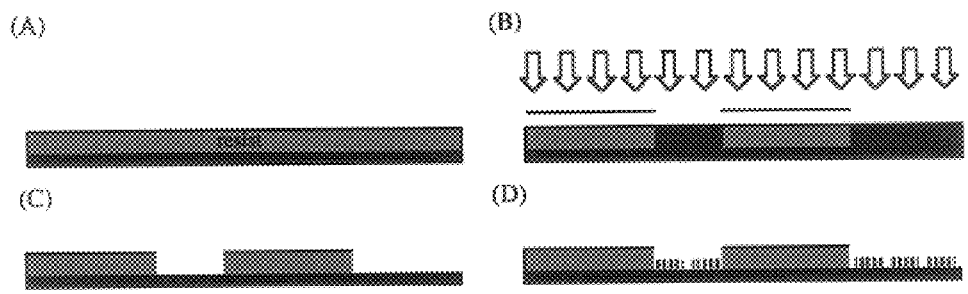
FIG. 11 is a schematic illustration showing (a) photoresist on a silicon substrate; (b) substrate patterning UV radiation; (c) removal of exposed resist by CD30; and (d) selective adsorption of protein crystal patterning elements in the exposed areas.

S-layers were selectively placed at desired locations on a substrate using a blocking scheme shown schematically in FIG. 11. Using a commercially available photoresist, Shipley 1818, a blocking layer was spun onto the substrate. The photoresist wass then exposed with LW radiation through a mask. The photoresist was then developed, exposing the areas of the substrate on which S-layers were desired. The S-layers were then applied, and titanium was deposited as described in Example 12. The photoresist was then removed, leaving the protein crystals only in the exposed regions. The photoresist blocked the adhesion in the unexposed areas.

Figure 12:
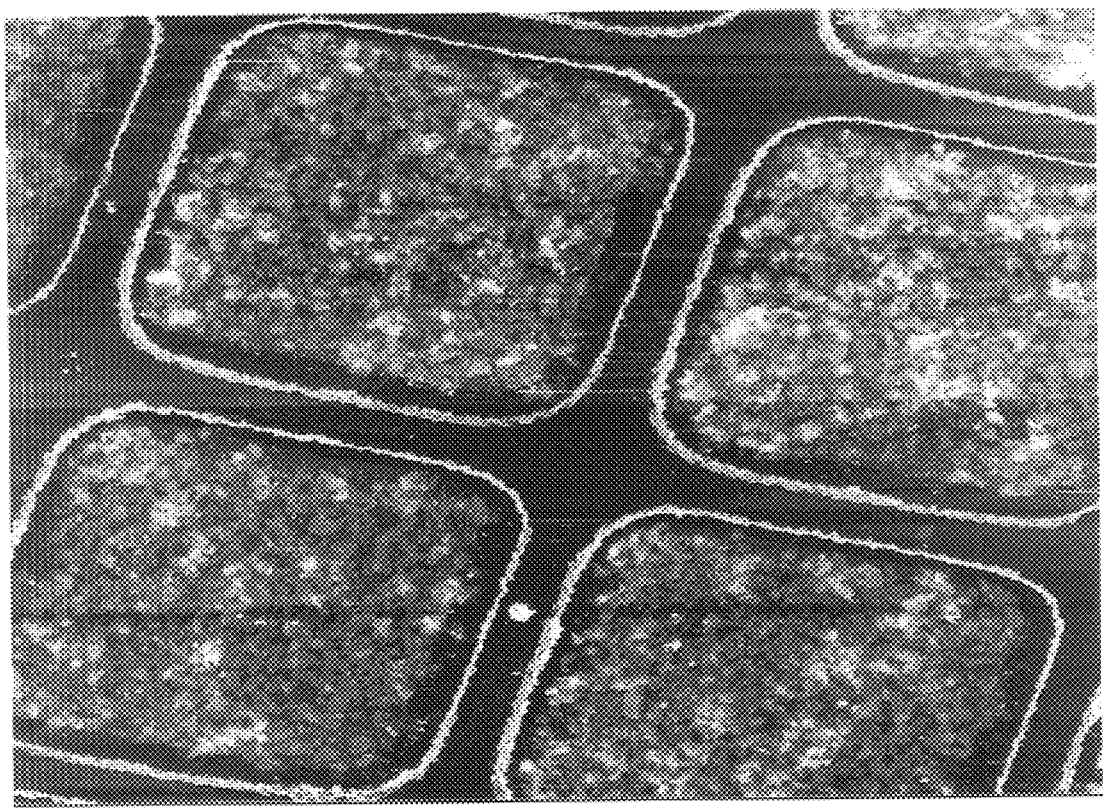
FIG. 12 is a top view AFM image of a sample after the photoresist has been removed in processing as illustrated in FIG. 11, showing the 100% selectivity of the blocking scheme.

FIG. 12 shows a pattern of S-layers that was created using a 1000-mesh TEM grid as a quick, inexpensive optical lithography mask. The concentration of the adsorbed S-layers may be controlled by controlling the concentration of the S-layers in the aqueous suspension before application.

The foregoing description is considered as illustrative only of the principles of the invention. Further, since numerous modifications and changes will readily occur to those skilled in the art, it is not desired to limit the invention to the exact construction and process shown as described above. Accordingly, all suitable modifications and equivalents may be resorted to falling within the scope of the invention.

We claim:

1. A method for preparing masks having ordered arrays of nanoscale pores, the method comprising the steps of:
   providing a patterning mask having a structure including an ordered array of nanoscale pores;
   mounting said patterning mask on a substrate; and
   applying a coating to at least part of said patterning mask by rotary shadowing at a preselected angle to form an etch/deposition mask having a preselected effective pore diameter different from the pore diameter of said patterning mask.

2. The method of claim 1, wherein said mask template is of biological origin.

3. The method of claim 2, wherein said providing step comprises:
   culturing an organism which synthesizes a material having a structure suitable for use as said mask template; and
   isolating said material.

4. The method of claim 3, wherein said organism is a bacterium of the genus Sulfolobus.

5. The method of claim 1, wherein said mounting step comprises:
   forming a suspension of a plurality of said etch/deposition masks in a liquid;
   applying said suspension to a surface of said substrate; and
   removing said liquid from said surface.

6. The method of claim 5, wherein one of said forming step and said applying step comprises adding a surfactant to said suspension to alter the ability of said liquid to wet said surface.

7. The method of claim 1, wherein said etch/deposition mask comprises a material selected from titanium, chromium, vanadium, tungsten, and combinations thereof.

8. The method of claim 1, wherein said applying step comprises forming said etch/deposition mask by applying a coating from a direction other than normal to said patterning mask.

9. The method of claim 1, wherein said applying step comprises applying a coating from a direction selected to provide an annulus of said coating within the pores of said patterning mask.

10. The method of claim 1, wherein said applying step comprises applying a coating from a direction selected to provide a larger pore diameter in said etch/deposition mask than the diameter of the pores of said patterning mask.

11. The method of claim 1, consisting essentially of the steps of:
    providing a patterning mask having a structure including an ordered array of nanoscale pores;
    mounting said patterning mask on a substrate; and
    applying a coating to at least part of said patterning mask by rotary shadowing at a preselected angle to form an etch/deposition mask having a preselected effective pore diameter different from the pore diameter of said patterning mask.

12. A method for fabricating ordered arrays of nanoscale features, the method comprising the steps of:
    providing a patterning mask having a structure including an ordered array of nanoscale pores;
    applying a coating to at least part of said patterning mask by rotary shadowing at a preselected angle to form an etch/deposition mask having a preselected effective pore diameter different from the pore diameter of said patterning mask; and
    using said etch/deposition mask for performing at least one operation on a substrate, wherein said operation is selected from depositing material on said substrate and removing material from said substrate based on the locations of the pores.

13. The method of claim 12, wherein said mask template is of biological origin.

14. The method of claim 12, wherein said mask template is obtained from bacteria of the genus Sulfolobus.

15. The method of claim 12, wherein said etch/deposition mask comprises a material selected from titanium, chromium, vanadium, tungsten, and combinations thereof.

16. The method of claim 12, wherein said direction is selected to provide an annulus of said coating within the pores of said patterning mask.

17. The method of claim 12, wherein said direction selected to provide a larger effective pore diameter in said etch/deposition mask than the diameter of the pores of said patterning mask, and said method comprises the additional step of removing material from around the pores of said patterning mask.

18. The method of claim 15, wherein said patterning mask and said etch/deposition mask have a pore spacing between about 3 nm and about 30 nm.

19. The method of claim 12, consisting essentially of the steps of:

providing a patterning mask having a structure including an ordered array of nanoscale pores;

applying a coating to at least part of said patterning mask by rotary shadowing at a preselected angle to form an etch/deposition mask having a preselected effective pore diameter different from the pore diameter of said patterning mask; and using said etch/deposition mask for performing at least one operation on a substrate, wherein said operation is selected from depositing material on said substrate and removing material from said substrate based on the locations of the pores.

* * * * *